United States Patent [19]

Yamagata et al.

[11] Patent Number: 5,362,358
[45] Date of Patent: Nov. 8, 1994

[54] DRY ETCHING APPARATUS AND METHOD OF FORMING A VIA HOLE IN AN INTERLAYER INSULATOR USING SAME

[75] Inventors: Yasushi Yamagata; Fumihide Sato, both of Tokyo, Japan

[73] Assignee: NEC Corporation, Japan

[21] Appl. No.: 61,440

[22] Filed: May 14, 1993

[30] Foreign Application Priority Data

May 14, 1992 [JP]  Japan ................................ 4-121509

[51] Int. Cl.$^5$ ............................................ B44C 1/22
[52] U.S. Cl. ........................................ 156/643; 156/345
[58] Field of Search ................... 204/192.37, 192.34, 204/298.31, 298.34; 156/643, 345

[56] References Cited

U.S. PATENT DOCUMENTS

| | | | |
|---|---|---|---|
| 4,075,583 | 2/1978 | Kershaw | 333/73 R |
| 4,585,516 | 4/1986 | Corn | 204/298.34 |
| 4,863,549 | 9/1989 | Granwald | 156/345 |
| 4,889,588 | 12/1989 | Fior | 156/643 |
| 4,902,377 | 2/1990 | Berglund | 156/643 |
| 5,013,400 | 5/1991 | Kurasaki | 156/643 |
| 5,116,482 | 5/1992 | Setoyama | 204/298.08 |
| 5,228,939 | 7/1993 | Chu | 156/345 |
| 5,250,165 | 10/1993 | Berglund | 204/192.32 |

Primary Examiner—R. Bruce Breneman
Assistant Examiner—Joni Chang
Attorney, Agent, or Firm—Laff, Whitesel, Conte & Saret

[57] ABSTRACT

In order to cyclically implement isotropical and anisotropical etching of an interlayer insulator provided in a semiconductor wafer, two variable capacitors are provided for applying RF bias (power) to a triode type dry etching apparatus. The two variable capacitors are controlled such that cyclically, as one of the two capacitors exhibits maximum capacitance thereof, the other capacitor exhibits minimum capacitance thereof. As an alternative to the above, a wafer supporting table provided in a reactive chamber of an electron cyclotron resonance type apparatus, is cyclically supplied with a radio frequency (RF) bias and the ground potential. This cyclic application of the RF bias and the ground potential is controlled by a combination of a pulse generator and an amplitude modulation circuit both coupled to an RF signal generator. The via hole is effectively formed using the cyclic operations of the isotropic and anisotropic etching.

2 Claims, 10 Drawing Sheets

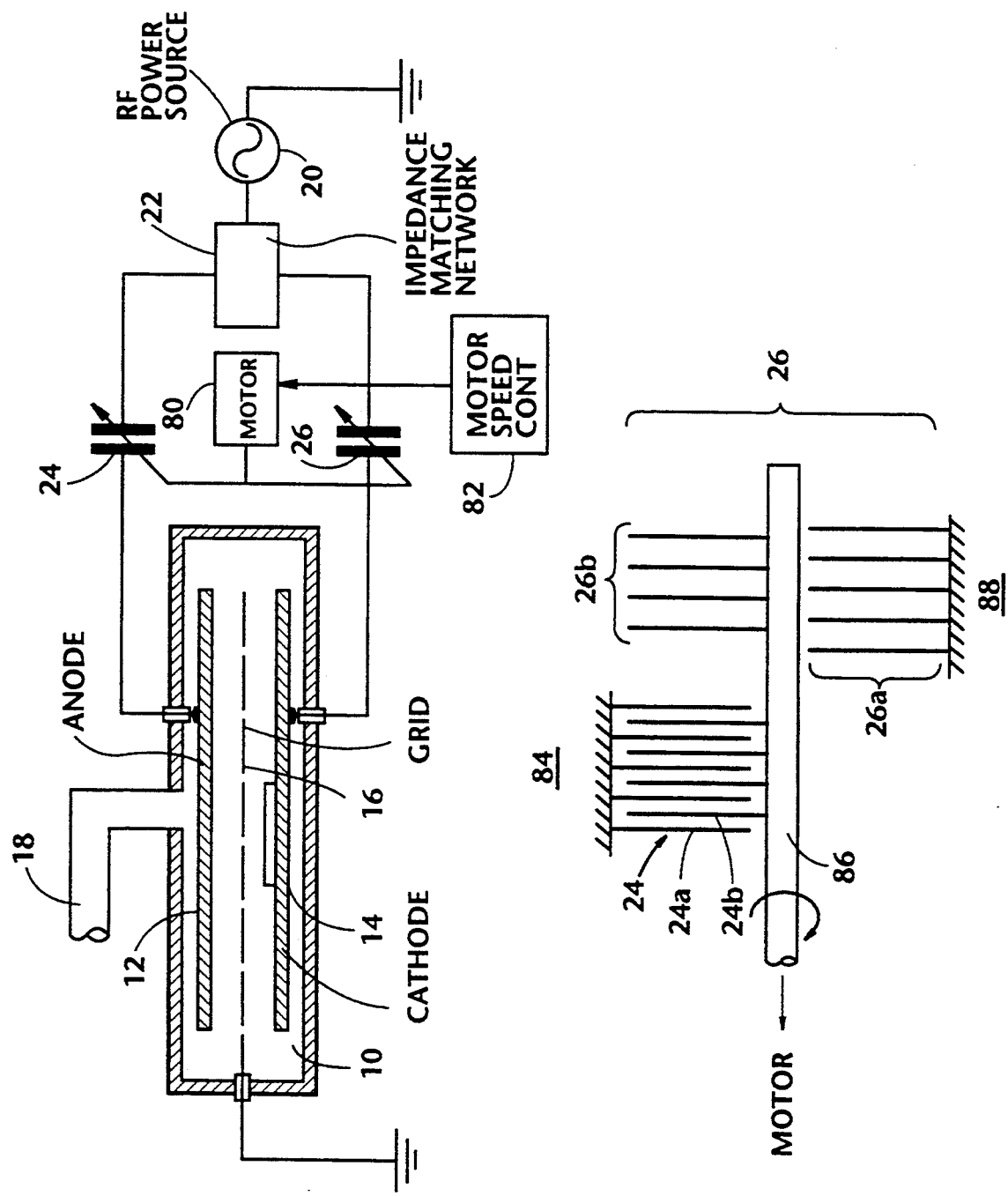

DRY ETCHING APPARATUS AND METHOD OF FORMING A VIA HOLE IN AN INTERLAYER INSULATOR USING SAME

BACKGROUND OF THE INVENTION

1. Field of the Invention

The present invention relates generally to a dry etching apparatus and a method of forming a via hole in an interlayer insulator using the dry etching apparatus. The present invention is concerned with periodical anisotropic and isotropic etching operations via which excellent aluminum step coverage of a via hole can be realized.

2. Description of the Related Art

Multilevel interconnections have become essential as semiconductor devices are miniaturized. In order to provide the multilevel interconnections, via holes formed in an interlayer insulator play an important role for interconnecting upper and lower layer's conductive lines.

As is well known in the art, a via hole is formed using both isotropic and anisotropic etching. In order to perform these two etching modes using the same etcher, two types of dry etching apparatus are currently used: one is a triode type etcher and the other is an ECR (Electron Cyclotron Resonance) type etcher.

Before turning to the present invention it is deemed advantageous to discuss the above-mentioned conventional dry etchers with reference to FIGS. 1 and 2.

FIG. 1 is a schematic cross sectional view of a known triode type dry etcher and associated apparatus. This apparatus is well known in the art and hence only a brief description will be given for the sake of brevity.

The arrangement of FIG. 1 generally includes an etching chamber 10 which is provided with an anode 12, a cathode 14, and a grounded grid electrode 16. The cathode 14 supports a semiconductor wafer 17 which is subject to dry etching. Etching gas is introduced into the etching chamber 10 and is evacuated therefrom via a duct 18. A radio frequency (RF) power source 20 is provided between an impedance matching network 22 and the ground. RF power obtained from the impedance matching network 22 is selectively applied to the anode 12 and cathode 14. The selective application of RF power to the electrodes 12 and 14, is carried out using controlling variable capacitors 24 and 26.

When isotropic etching is to be implemented with the dry etching apparatus shown in FIG. 1, the variable capacitors 24 and 26 are controlled such as to apply RF power only to the anode 12. In this instance, no plasma ions reach the cathode 14 and thus neutral radicals alone play a role in isotropic etching. It is a usual practice to raise the temperature of the cathode 14 during the isotropic etching.

On the other hand, in order to anisotropically etch the wafer 17, the RF power is applied solely to the cathode 14 by controlling the variable capacitors 24 and 26. The etching in this case is reactive ion etching (RIE).

Reference is made to FIG. 2, wherein the second type of known dry etching apparatus which uses electron cyclotron resonance (ECR), is schematically shown.

The ECR type dry etcher, depicted by numeral 30, is provided with an etching chamber (reaction chamber) 34, and a wafer supporting table 36 on which a semiconductor wafer 38 is located. A waveguide 42 is provided for guiding microwave from a magnetron (not shown) into the etching chamber 34 through a quartz tube or dome 35. The chamber 34 is surrounded by a magnetic ring coil 46. The wafer supporting table 36 is heated by a heater 48 which is connected to a suitable power source (not shown). The temperature of the table 36 is controlled by the heater 48 and cooling water. Further, the wafer supporting table 36 is coupled to a RF power source 50 via an impedance matching network 52.

With this arrangement, a highly ionized plasma is generated at low gas pressures within the chamber 34 under an ECR condition wherein a microwave frequency coincides with the electron cyclotron frequency determined by magnetic flux density. These operations are well known in the art and further descriptions thereof are deemed unnecessary.

In the case where anisotropic etching is to be implemented, the RF power source 50 applies RF power (or bias) to the wafer supporting table 36 via the impedance matching network 52. Contrarily, isotropic etching is performed when the table 36 is grounded. In this case, the table 36 is held at temperatures ranging from 50° C. to 150° C.

Fabrication processes for forming two-level aluminum interconnections, using either of the above-mentioned two dry etchers, will be discussed with reference to FIGS. 3A-3C. In order to establish the two-level interconnection, a plurality of via holes are formed in a single interlayer insulator.

As shown in FIG. 3A, a field insulating layer 60 is selectively deposited on a semiconductor substrate 62, after which a first interlayer insulator 64 is formed on the entire surface thereof. An aluminum layer (not shown) is formed by sputtering so as to cover insulator 64 and the exposed portion of the substrate 62. Thereafter, the aluminum layer thus formed undergoes patterning, using photolithography, to form the first level aluminum interconnecting lines 66a, 66b and 66c. The entire surface of the wafer is then covered with a second insulating layer 68 whose upper surface is essentially flat. The thickness of the insulating layer 68 above each of the aluminum lines 66a and 66b is depicted by Ha, while the thickness of the insulating layer 68 above the aluminum line 66c is depicted by Hb. Following this, a photoresist film 70 is patterned on top of the insulating layer 68 in preparation for the formation of via holes in the subsequent steps shown in FIGS. 3B and 3C.

The wafer which has been subject to the processes discussed with FIG. 3A, is then placed in one of the two dry etching apparatuses shown in FIGS. 1 and 2.

The device is isotropically etched using Ar+CF$_4$ gas. That is, the isotropical etching is implemented by F or CFx radicals. The amount of isotropical etch of the insulating layer 68 in the vertical and lateral directions Y1 and X1, are approximately identical.

Subsequently, the wafer is anisotropically etched using F or CFx ions within the same dry etching apparatus as the wafer has been isotropically etched. When the insulating layer 68 undergoes anisotropical etching in the vertical direction by the amount of (Ha−Y1), two via holes VH1 and VH2 are formed which respectively reach the surfaces of the aluminum lines 66a and 66b. During the anisotropic etching, aluminum sputtering occurs at the surfaces of the aluminum lines 66a and 66b due to ion bombardment. The sputtered aluminum reacts with F or CFx ions. Thus, aluminum fluoride is generated which accumulates on the walls of the via holes VH1 and VH2. The accumulated aluminum fluoride is denoted by numeral 72. It should be noted that the aluminum fluoride does not accumulate on the surfaces of the aluminum lines 66a and 66b.

After completion of the above-mentioned processes, the wafer is subject to anisotropic etching to form a via hole VH3 by etching the insulating layer 68 by the amount of (Hb−Ha) in the vertical direction.

After developing the above-mentioned via holes VH1–Vh3, the photoresist film 70 and the aluminum fluoride 72 are removed. Then, an aluminum layer is deposited over the entire top surface of the device, after which the aluminum layer is patterned, using lithography, to provide three interconnecting portions 72a, 72b and 72c which are respectively coupled to the aluminum lines 66a, 66b and 66c, as shown in FIG. 3C.

With the above-mentioned conventional dry etching, only one switching of the two dry etching modes is possible. In more specific terms, the time duration of each of the two etching steps is very short (for example, 300 ms). Accordingly, it is practically impossible to switch over between isotropic and anisotropic etching two or more times.

If the via holes are formed using one isotropic etching step and one anisotropic etching step (viz., only one switching from one etching mode to the other), the shoulder of the via hole VH3 at the second insulating layer 68 is insufficiently covered with aluminum. This insufficient step coverage is induced in the case where the depth of the vertical portion of the via hole (such as VH3) is large relative to the diameter thereof. This poor step coverage tends to cause breakdown of the multi-level interconnection.

In order to overcome the aforesaid step coverage problem, one method has been proposed wherein the internal insulator 68 is further anisotropically etched such that the etching depth (depicted by Y2) is larger than Y1 and less than Ha (viz., Y1<Y2<Ha), as schematically shown in FIG. 4. However, this approach induces another problem that the distance between the via holes is undesirably narrowed to an extent that the aluminum interconnections 72a and 72b (FIG. 3C) are liable to contact each other. This problem may be eliminated by providing sufficient separation between the aluminum lines 66a and 66b. However, this technique inversely affects the current tendency of device miniaturization.

Further, in order to ensure that the bottom of the via hole VH1 (or VH2) is located on each of the aluminum lines 66a and 66b, it is necessary to widen the lines 66a and 66b as shown in FIG. 5. This also undesirably induces an obstacle to device miniaturization.

SUMMARY OF THE INVENTION

It is an object of the present invention to provide an improved dry etching apparatus via which two etching modes (via., isotropic and anisotropic etching) can be cyclically implemented two or more times.

Another object of the present invention is to provide a method of forming via holes which enables excellent step coverage through the use of alternate isotropic and anisotropic etchings.

Briefly, these objects are fulfilled by cyclically implementing isotropical and anisotropical etching of an interlayer insulator provided in a semiconductor wafer. To this end, two variable capacitors are provided for applying RF bias (power) to a triode type dry etching apparatus. The two variable capacitors are controlled such that cyclically, as one of the two capacitors exhibits maximum capacitance thereof, the other capacitor exhibits minimum capacitance thereof. As an alternative to the above, a wafer supporting table provided in a reactive chamber of an electron cyclotron resonance type apparatus, is cyclically supplied with a radio frequency (RF) bias and the ground potential. This cyclic application of the RF bias and the ground potential is controlled by a combination of a pulse generator and an amplitude modulation circuit both coupled to an RF signal generator. The via hole is effectively formed using the cyclic operations of the isotropic and anisotropic etching.

More specifically, an aspect of the present invention resides in a dry etching apparatus for etching an interlayer insulator provided in a semiconductor wafer, comprising: first means for isotropically etching the interlayer insulator using etching gas which includes Ar and F; second means for implementing anisotropic etching using the etching gas, when aluminum layer is exposed during the anisotropic etching, the anisotropic etching inducing aluminum fluoride by sputtering the aluminum layer; and third means for cyclically inducing the first and second means to be operative.

Another aspect of the present invention resides in a dry etching apparatus for etching an interlayer insulator provided in a semiconductor wafer, comprising: first means for generating microwave; second means for locating the semiconductor wafer therewithin, the second means being a chamber and locating the semiconductor wafer on a wafer supporting table; third means for guiding the microwave to the second means; fourth means for inducing magnetic field within the second means; and fifth means operatively coupled to the wafer supporting table, the fifth means cyclically applying radio frequency bias and ground potential to the wafer supporting table for alternately inducing anisotropic etching and isotropic etching of the semiconductor wafer.

Still another aspect of the present invention resides in a method of forming a via hole in an interlayer insulator provided in a semiconductor wafer, the via hole being used to interconnect between aluminum lines located at opposite ends of the via hole, the method comprising the steps of: (a) implementing isotropical etching the interlayer insulator using etching gas including Ar and F; and (b) implementing anisotropical etching the interlayer insulator using the etching gas, the isotropical and anisotropical etching being cyclically executed.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 6 is a diagram schematically showing a first dry etching apparatus according to the present invention;

FIG. 7 is a diagram schematically showing a variable capacitor arrangement used in the arrangement of FIG. 6;

DETAILED DESCRIPTION OF THE PREFERRED EMBODIMENTS

A first preferred embodiment of the present invention will be discussed with reference to FIGS. 6–7.

Figure 1:
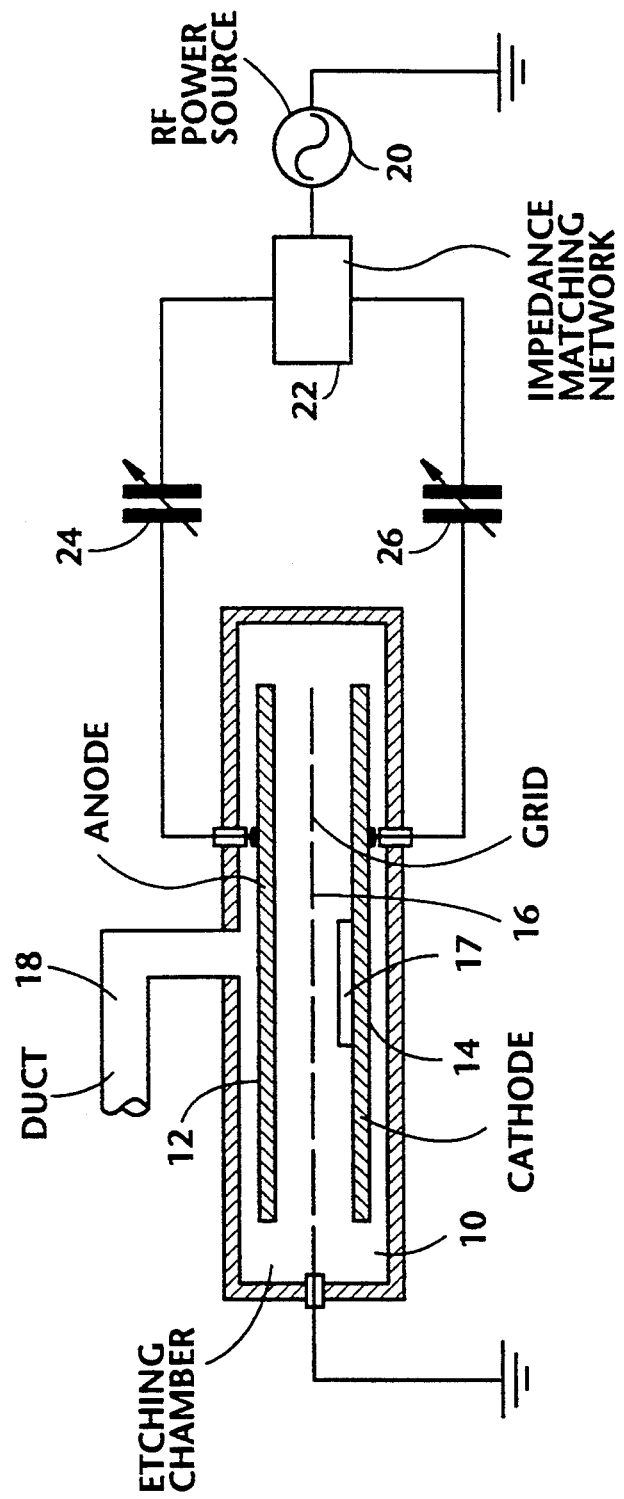
FIG. 1 is a partially cross sectioned diagram schematically showing the known triode type dry etching apparatus and the associated apparatus, discussed in the opening paragraphs of the instant disclosure.

The arrangement of FIG. 6 differs from that of FIG. 1 in that: (a) the former arrangement further includes a motor 80 and a motor speed controller 82 and (b) the variable capacitors 24 and 26 are operatively coupled with the motor 80 and arranged so that cyclically, as the capacitance of one is maximized the capacitance of the other is minimized.

As shown in FIG. 7, one set of capacitor blades 24a of the capacitor 24 is secured to a stationary member 84 while the other set of capacitor blades 24b thereof are rigidly attached to a rotatable shaft 86 which is driven by the motor 80. Similarly, the capacitor 26 is provided with one set of capacitor blades 26a secured to a stationary member 88 while the other set of capacitor blades 26b are attached to the same side of the shaft 86 as the blades 24b.

When the motor 80 rotates the shaft 86 in one direction at a given constant speed, the blades 24b pass between the blades 24a while the blades 26b are separated from the blades 26a. Thus, each of the capacitors 24 and 26 alternately exhibits its respective maximum and minimum capacitance.

As mentioned in the opening paragraphs, when the capacitor 24 exhibits its maximum capacitance, the anode 12 is supplied with the RF power and hence the isotropic dry etching is implemented. In this instance, the anisotropic etching is inhibited because the capacitor 26 prevents RF power from being applied to the cathode 14. Contrarily, if the capacitors 24 and 26 exhibit their respective minimum and maximum capacitance, anisotropic dry etching is enabled.

The rotation speed of the shaft 86, although empirically determined depending on applications, may be 10 rotations per second merely by way of example.

Figure 8:
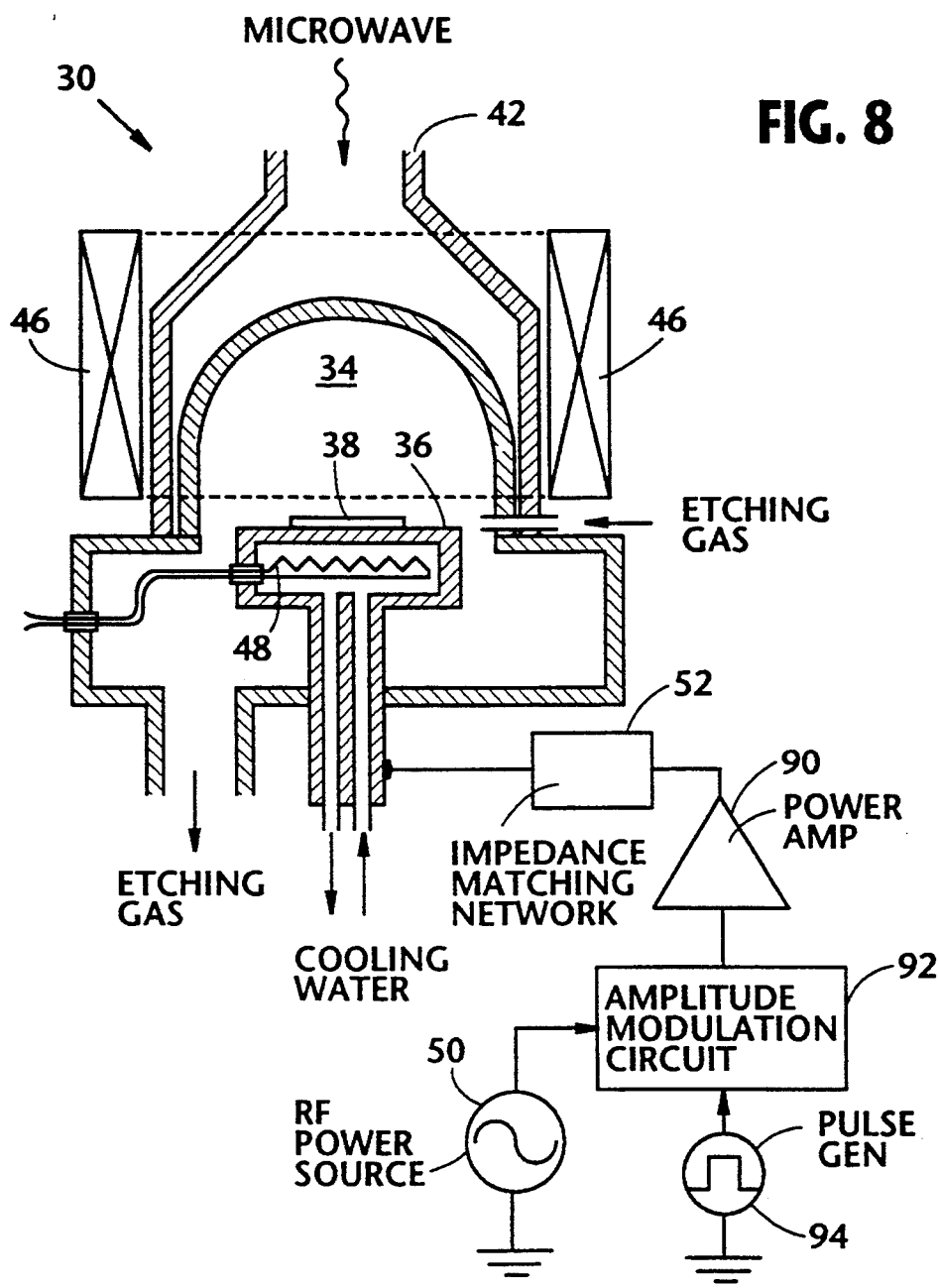
FIG. 8 is a diagram schematically showing a second dry etching apparatus according to the present invention.

Reference is made to FIG. 8, wherein a second embodiment of the present invention is schematically shown.

Figure 2:
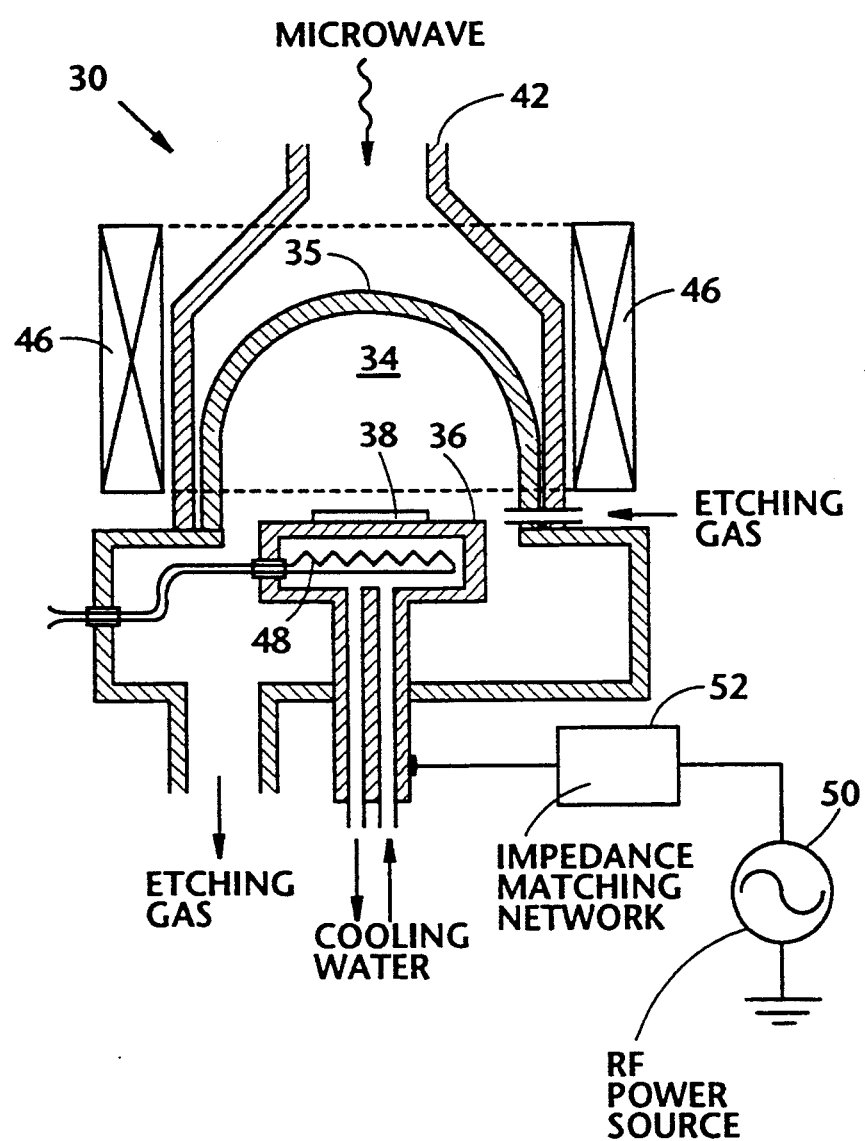
FIG. 2 is a partially cross sectioned diagram schematically showing the ECR type dry etching apparatus and the associated apparatus, discussed in the opening paragraphs of the instant disclosure.

The arrangement of FIG. 8 differs from that of FIG. 2 in that the former arrangement further includes a power amplifier 90, an amplitude modulation (AM) circuit 92, and a pulse generator 94. The RF power obtained from the RF power source 50 is amplitude modulated by a rectangular (for example) pulse applied from the pulse generator 94. The output of the AM circuit 92 is amplified by the power amplifier 90 and then applied to the wafer table 36 via the impedance matching network 52.

Figure 9:
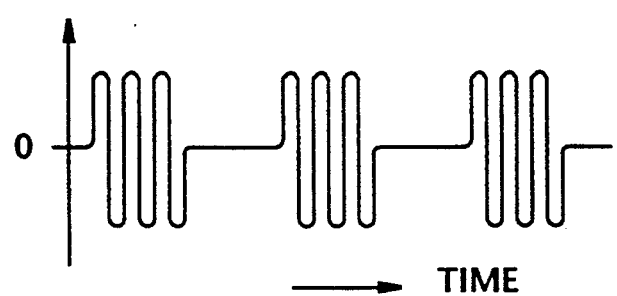
FIG. 9 is a waveform of an output of a block of FIG. 8.

FIG. 9 shows schematically output waveforms of the AM circuit 92. As shown, the output of the AM circuit 92 alternately exhibits RF power and the ground potential. Thus, the isotropic and anisotropic etching processes alternately takes place during the time durations of the RF power and the ground level, respectively. The number of the alternate occurrences of the RF power and the ground level, is about 10 times per second merely by way of example. However, this value may be determined depending on applications. Further, the duty factor of the pulse generated by the pulse generator 94 can easily be changed.

Each of the following embodiments of the present invention, relates to a method of forming a via hole and utilizes more than two cycles of isotropic and anisotropic etching processes using either of the two dry etching apparatus shown in FIGS. 6 and 8. The techniques which characterize the present invention can be classified into two categories depending on whether the amounts of isotropic and anisotropic etching during each cycle (depicted by Di and Da) are equal or different.

FIGS. 10A-10D depict the situation wherein the third embodiment of the present invention is implemented. In accordance with the third embodiment, three cycles of the isotropic and anisotropic etching are implemented and during each cycle the amount of each type of etching is the same (viz., Da/Di=1/1). Etching gas is $CF_4+Ar$ gas.

Figure 10A:
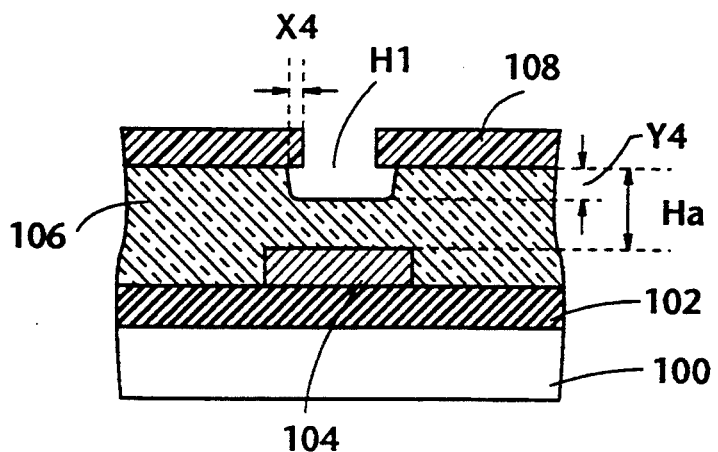
FIGS. 10A-10D are cross sectional views of a semiconductor wafer depicting a via hole formation sequence according to the present invention.

The upper surface of a semiconductor substrate 100 is entirely covered with an insulating layer 102. A first-level aluminum line 102 is then selectively formed on the insulating layer 102, after which an interlayer insulator 106 is deposited over the entire upper surface of the wafer. The upper surface of the insulator 106 is essentially flattened. The thickness of the interlayer insulator 106 above the aluminum line 104 is depicted by Ha. The patterning of a photoresist layer for selective formation is achieved to deposit an etch mask 108 on the upper surface of the insulator 106. Following this, isotropic and anisotropic etching of the first cycle and isotropic etching of the second cycle, are sequentially implemented to form a hole H1 (FIG. 10A). Designating the amounts of etching in the vertical and lateral directions by Y4 and X4 respectively, then Y4/X4=3/2.

Figure 10B:
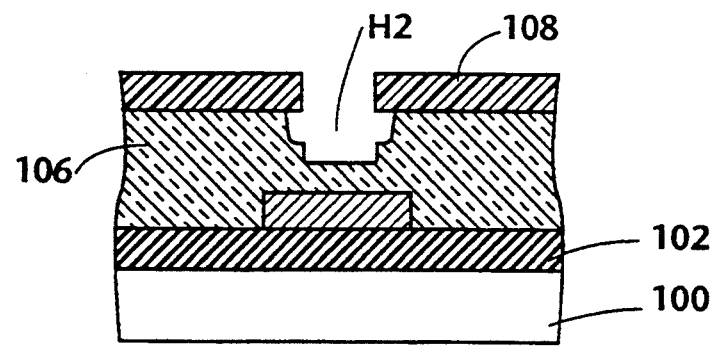

A hole H2 is then formed by anisotropical etching of the second cycle, as shown in FIG. 10B. In this instance, the etching in the lateral direction does take place.

Figure 10C:
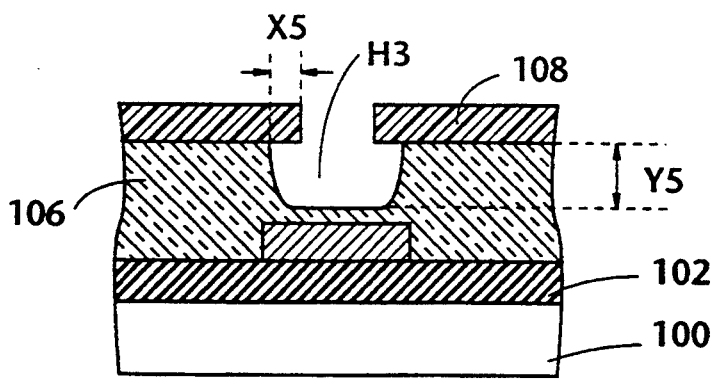

Subsequently, a hole H3 shown in FIG. 10C is formed by isotropical etching of the third cycle. Designating the amounts of etching in the vertical and lateral directions by Y5 and X5 respectively, then we obtain Y5/X5=5/3.

Figure 3A:
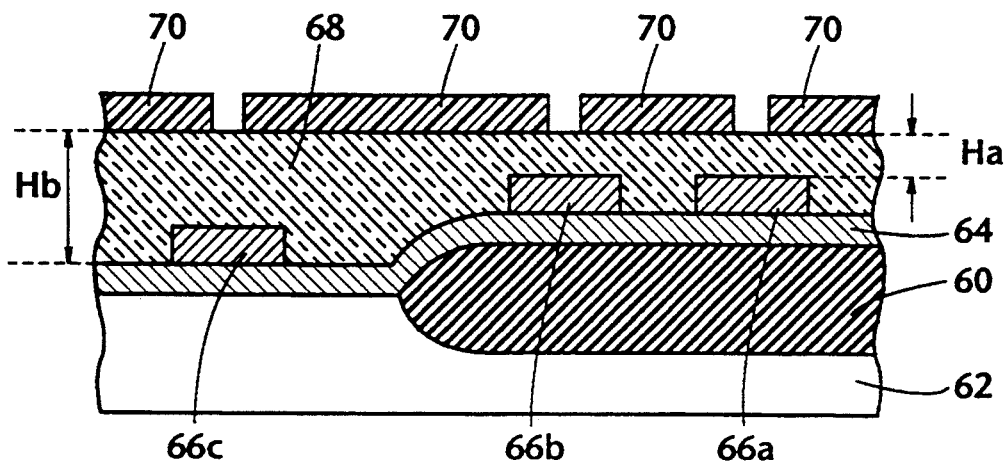
FIGS. 3A–3C are cross sectional views of a semiconductor wafer demonstrating the via hole formation sequence discussed in the opening paragraphs of the instant disclosure.
Figure 3B:
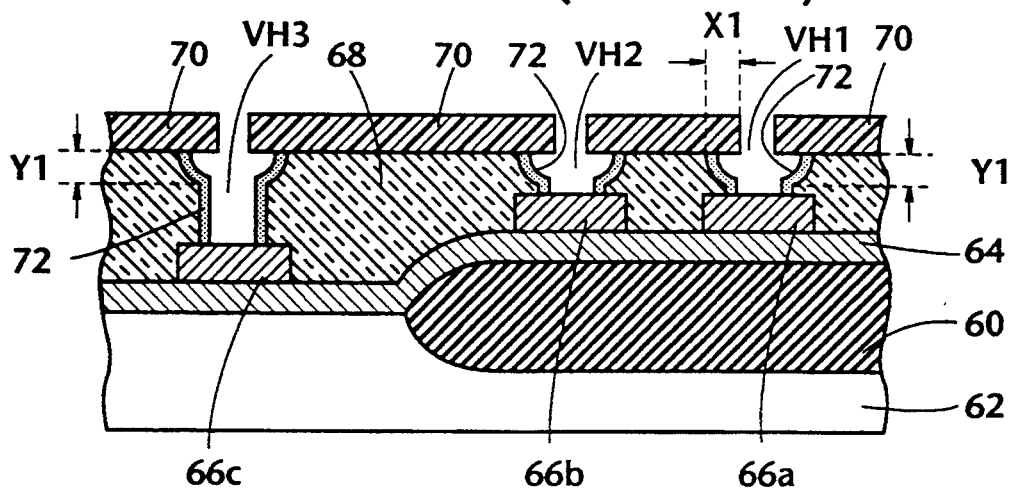
Figure 10D:
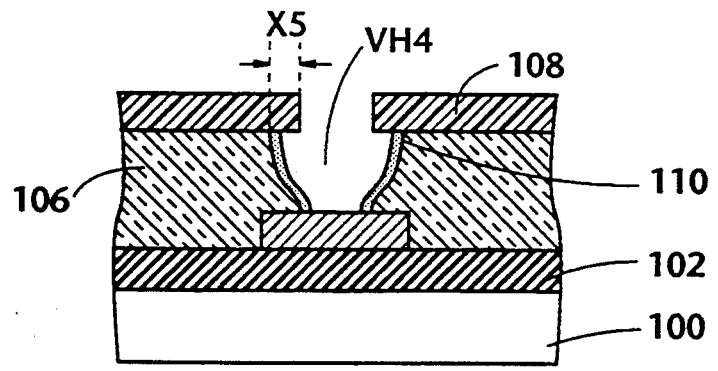

A via hole VH3 is eventually formed as shown in FIG. 10D by implementing anisotropic etching of the third cycle. In this process, aluminum fluoride (depicted by numeral 110) accumulates on the walls of the via hole VH3 as mentioned in the opening paragraphs of this disclosure. It is understood that Ha/X5=6/3=2/1 and the steps of the via hole VH4 are made very smooth as compared with those shown in FIG. 3B.

Figure 11:
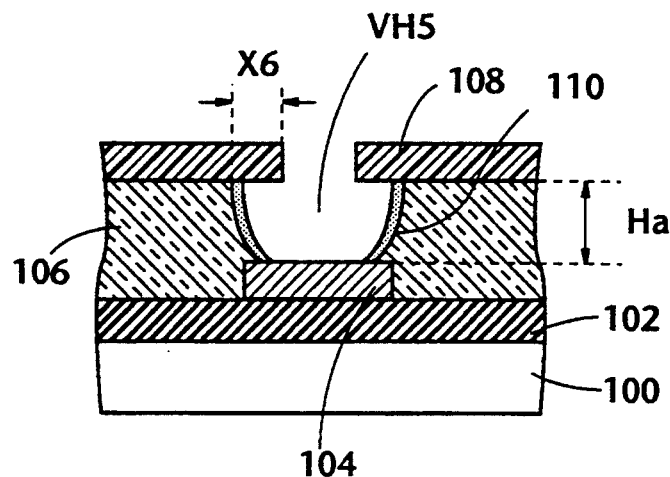
FIGS. 11-13 each is a cross sectional view of a semiconductor wafer depicting via hole formation according to the present invention.

FIG. 11 is a cross sectional view of a semiconductor wafer wherein a via hole VH5 is formed using more than three cycles of isotropic and anisotropic etching processes under the condition of Da/Di=1/1. In this instance, the wall of the via hole VH4 is further smoothed as compared with the third embodiment shown in FIGS. 10A–10D. In FIG. 11, designating the amount of etching in the lateral direction by X6, then Ha/X6=2/1 as in the third embodiment.

Figure 12:
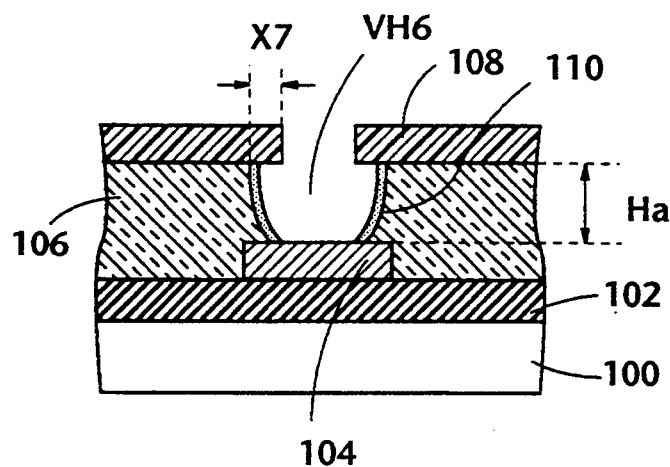

FIG. 12 is a cross sectional view of a semiconductor wafer wherein a via hole VH7 is formed using more than three cycles of isotropic and anisotropic etching processes under the condition of Da/Di=2/1. In this instance, the amount of etching in the lateral direction is smaller that shown in FIG. 11. In FIG. 12, designating the amount of etching in the lateral direction by X7, then Ha/X7=3/1.

Figure 13:
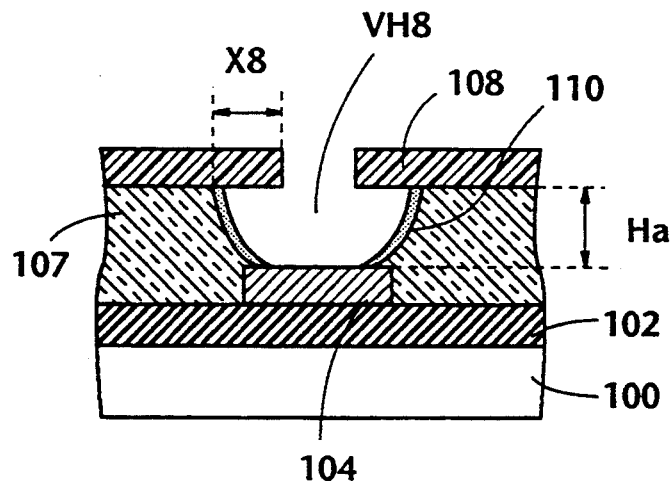

FIG. 13 is a cross sectional view of a semiconductor wafer wherein a via hole VH8 is formed using more than three cycles of isotropic and anisotropic etching processes under the condition of Da/Di=1/4. In this instance, the amount of etching in the lateral direction is larger that each of those shown in FIGS. 11 and 12. In FIG. 13, designating the amount of etching in the lateral direction by X8, then Ha/X8=5/4.

It is understood from the foregoing that the amount of etching in the lateral direction can approximately be determined by the thickness of the interlayer insulator and Da/Di. If the amount of etching in the lateral direction should be decreased, the ratio of Da/Di is increased. In other words, the amount of etching in the vertical direction should be increased.

Figure 3C:
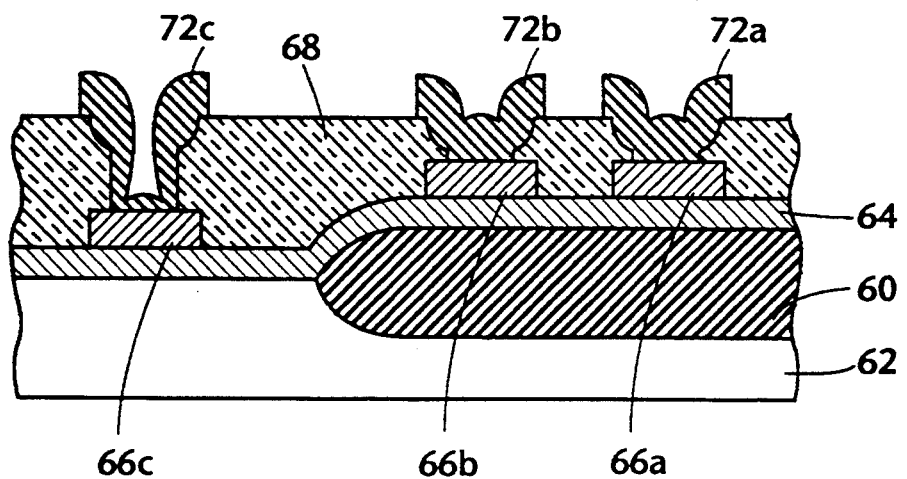
Figure 4:
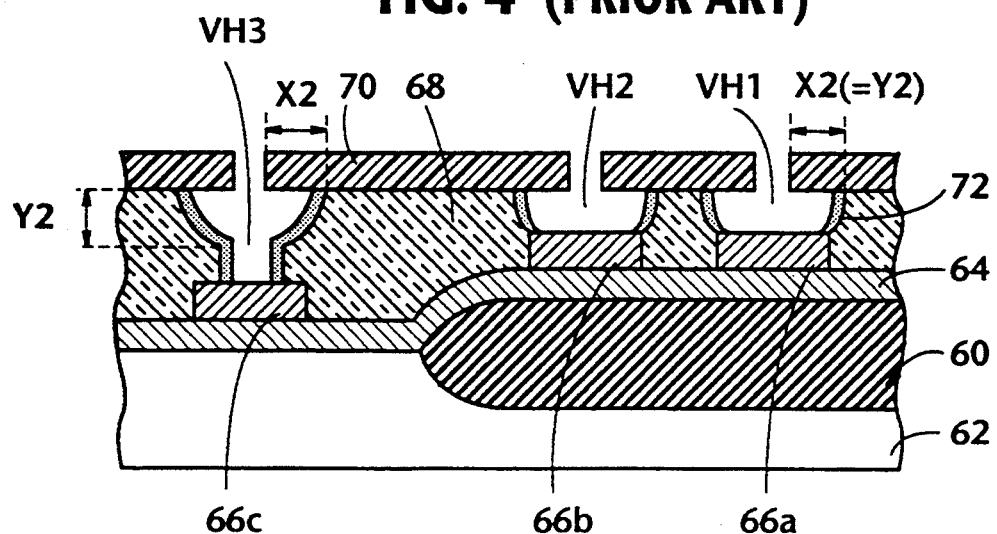
FIGS. 4 and 5 are respectively cross sectional views of a semiconductor wafer depicting a via hole formation technique, discussed in the opening paragraphs of the instant disclosure.
Figure 5:
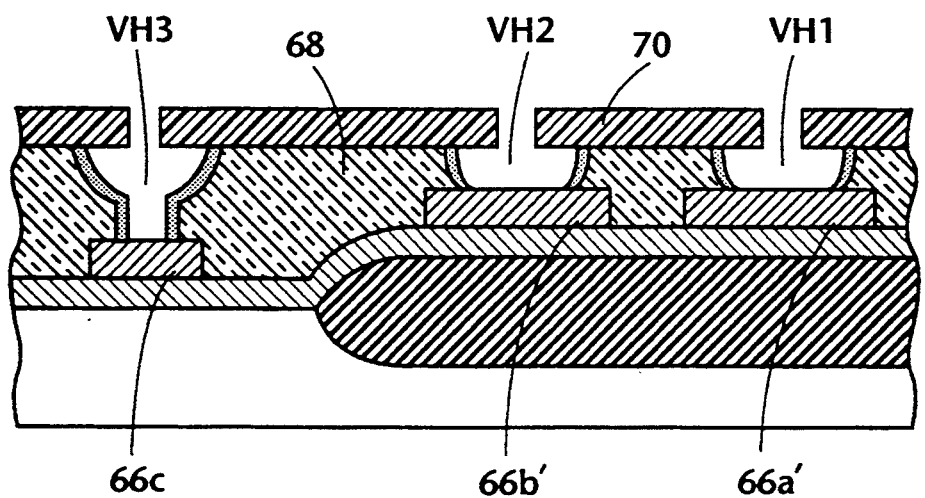
Figure 14A:
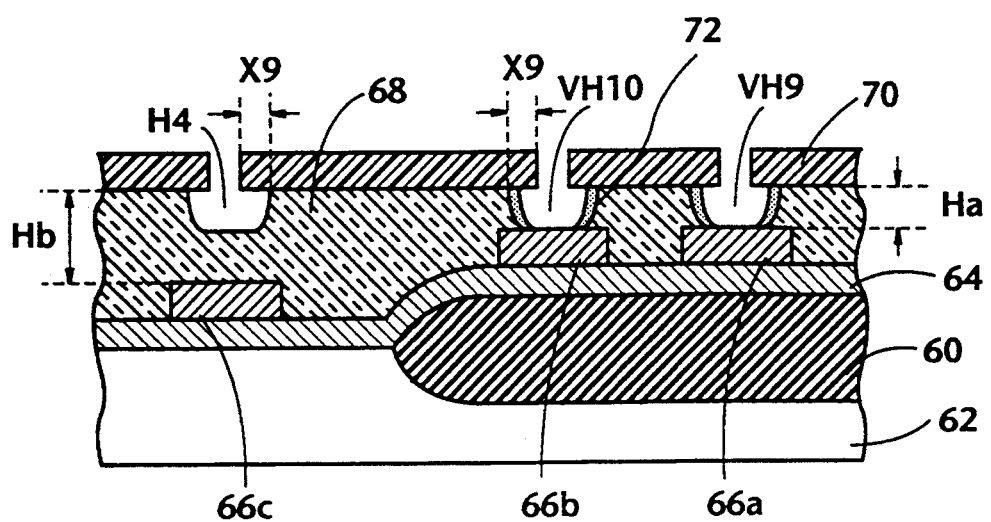
FIGS. 14A-14C are cross sectional views of a semiconductor wafer depicting a via hole formation sequence according to the present invention.
Figure 14B:
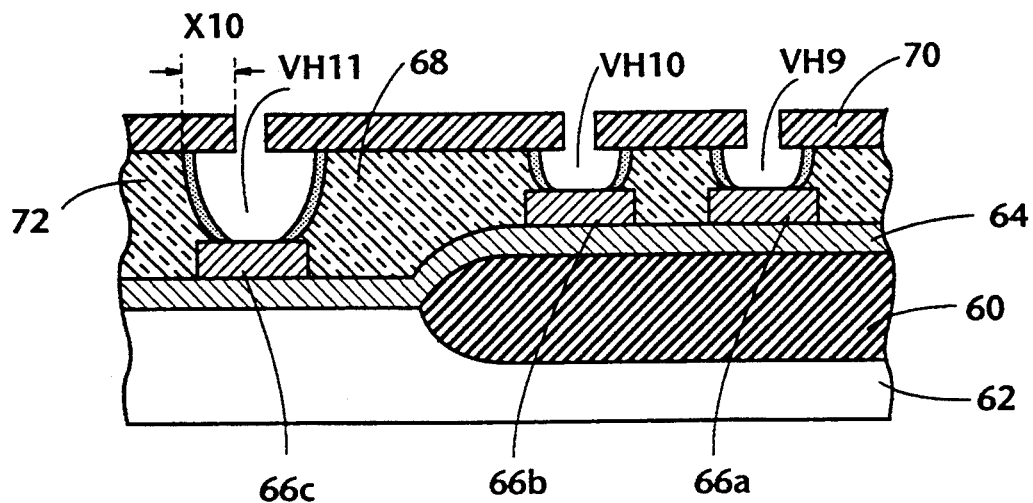
Figure 14C:
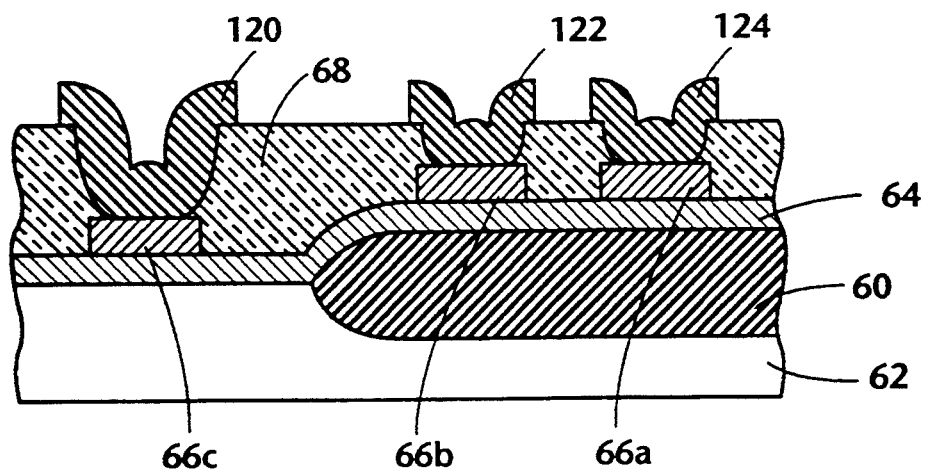

FIGS. 14A–14C are cross sectional views of a semiconductor wafer depicting via hole formation sequence under the condition of Da/Di=1/1. In this instance, a plurality of isotropic and anisotropic etching cycles (preferably more than three cycles) are implemented for via hole formation. The wafer shown in FIGS. 14A–14C is identical to that shown in FIGS. 3A–3C, and thus like numerals are used in FIGS. 14A–14C to indicate counterparts of thereof. As shown in FIG. 14C, excellent step coverage can be achieved and thus breakdown of aluminum interconnecting portions 120, 122, and 124 can effectively be prevented. Further descriptions for the via hole formation with respect to FIGS. 14A–14C are deemed unnecessary in that these have been discussed in the opening paragraphs.

Figure 15A:
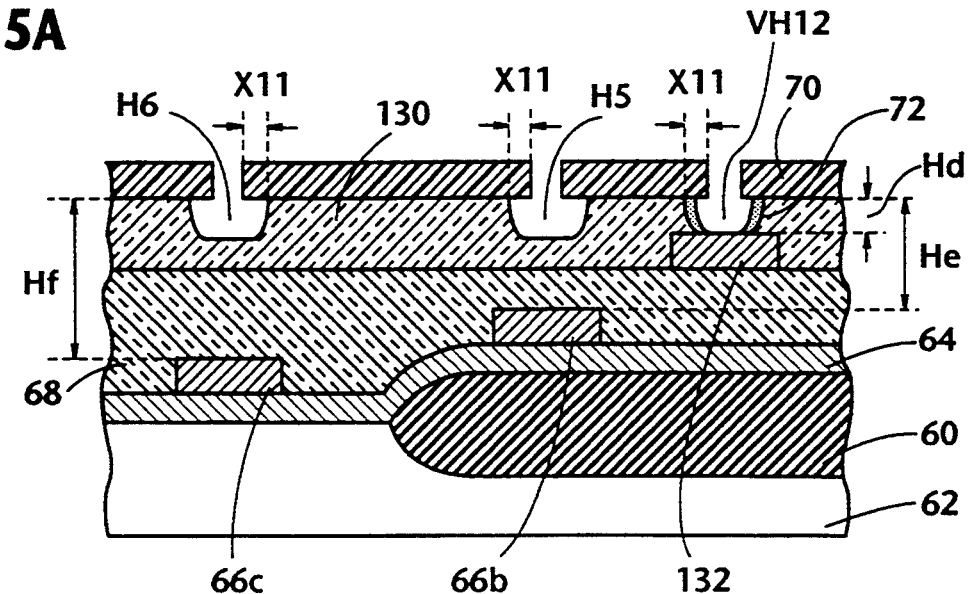
FIGS. 15A-15C are cross sectional views of a semiconductor wafer depicting a via hole formation sequence according to the present invention.
Figure 15B:
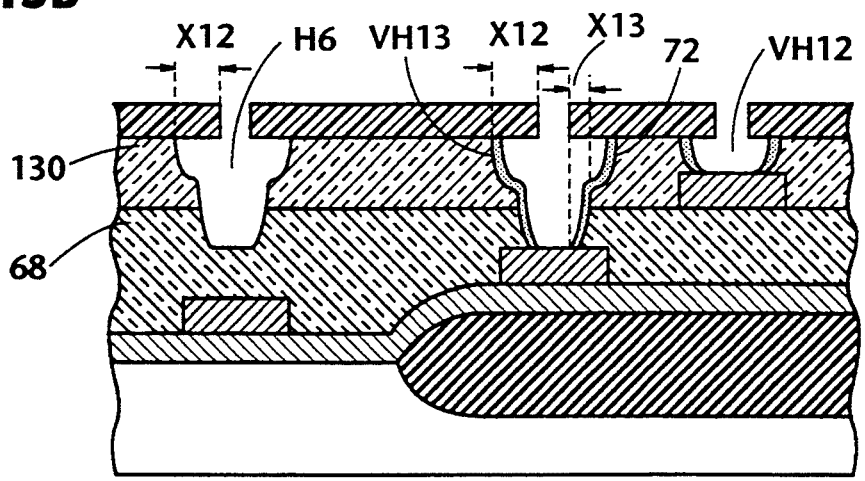
Figure 15C:
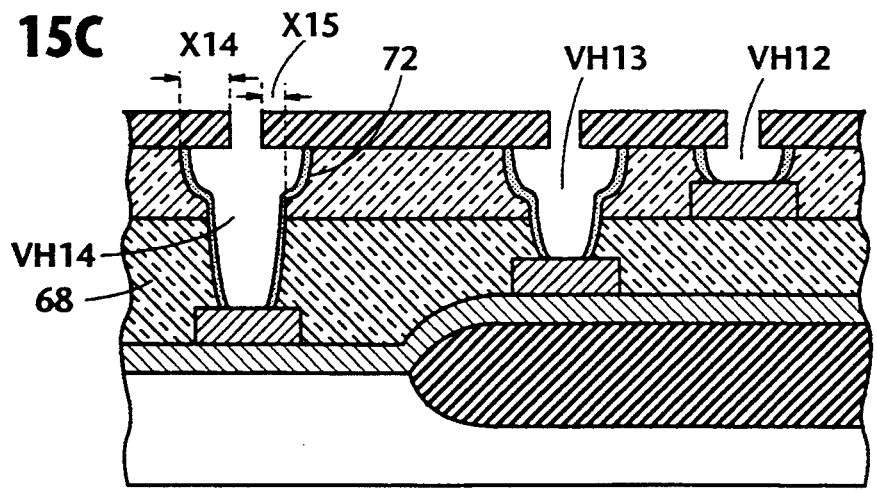

FIGS. 15A–15C are cross sectional views of a semiconductor wafer depicting via hole formation sequence by changing the value of Da/Di.

The semiconductor wafer shown in each of FIGS. 15A–15C before starting the via hole formation, differs from that of each shown in FIGS. 14A–14C in that: (a) the former wafer further includes an interlayer insulator 130 deposited over the insulator 68; (b) the former wafer includes an aluminum interconnecting line 132 on the insulator 68; (c) the former wafer does not includes the aluminum line 66a which is provided in the latter wafer. The insulator 130 is made of the same material as the insulator 68.

The layer arrangement or provision of FIGS. 15A–15C, can be understood from the above-mentioned descriptions and hence will not be discussed for the sake of brevity.

Firstly, the wafer undergoes cyclic isotropic and anisotropic etching under the condition of Da/Di=1/1 as above discussed. Thus, a via hole VH12 is formed and at the same time two holes H5 and H6 are formed as shown in FIG. 15A. Aluminum fluoride accumulates on the side walls of the via hole VH12. The amount of lateral etching in each of the holes VH12, H5 and H6 is depicted by X11 which equals Hd/2.

Subsequently, the value of Da/Di is changed from 1/1 to 4/1 and then implement etching. When the insulators 130 and 68 are etched by the thickness (He−Hd), the via hole VH13 is formed as shown in FIG. 15B. Similarly, aluminum fluoride accumulates on the side walls of the via hole VH13. The amount of lateral etching in each of the holes VH13 and H6 is denoted by X12. Thus, X12=X11+X13 and (He−Hd)/X13=5/1. This etching process continues until the via hole VH14 is formed. In this instance, the insulator 68 is etched by (Hf−He). Aluminum fluoride accumulates on the side walls of the via hole VH14. The amount of lateral etching in each of the holes VH14 is depicted by X14. Thus, X14=X11+X15 and (Hf−Hd)/X15=5/1.

It will be understood that the above disclosure is representative of several possible embodiments of the present invention and that the concept on which the invention is based is not specifically limited thereto.

What is claimed is:

1. A dry etching apparatus for etching an interlayer insulator provided in a semiconductor wafer, comprising:

first means for isotropically etching said interlayer insulator using etching gas which includes Ar and F;

second means for implementing anisotropic etching using said etching gas, when an aluminum layer is exposed during said anisotropic etching, said anisotropic etching inducing aluminum fluoride by sputtering said aluminum layer; and third means for cyclically inducing said first and second means to be operative, said third means including a first variable capacitor operatively coupled to said first means; a second variable capacitor operatively coupled to said second means; and fourth means operatively coupled to said first and second capacitors, said fourth means controlling said first and second capacitors such that cyclically, as one of said first and second capacitors exhibits a maximum capacitance thereof, the other capacitor exhibits a minimum capacitance thereof.

2. A dry etching apparatus as claimed in claim 1, wherein said fourth means includes:

a rotatable shaft to which said first and second capacitors are operatively coupled, said rotatable shaft rotating such as to control said first and second capacitors such that cyclically, as one of said first and second capacitors exhibits a maximum capacitance thereof, the other capacitor exhibits a minimum capacitance thereof; and a motor arranged to rotate said rotatable shaft.

* * * * *